(12) United States Patent
Li et al.

(10) Patent No.: US 12,389,537 B2
(45) Date of Patent: Aug. 12, 2025

(54) ELECTRONIC DEVICE

(71) Applicant: PanelSemi Corporation, New Taipei (TW)

(72) Inventors: Chin-Tang Li, New Taipei (TW); Chao-Jung Chen, New Taipei (TW)

(73) Assignee: PANELSEMI CORPORATION, New Taipei (TW)

( * ) Notice: Subject to any disclaimer, the term of this patent is extended or adjusted under 35 U.S.C. 154(b) by 196 days.

(21) Appl. No.: 18/463,728

(22) Filed: Sep. 8, 2023

(65) Prior Publication Data
US 2024/0098896 A1    Mar. 21, 2024

(30) Foreign Application Priority Data

Sep. 8, 2022   (TW) .................................. 111134192
Apr. 21, 2023  (TW) .................................. 112115051

(51) Int. Cl.
*H05K 1/11*        (2006.01)
*H05K 1/18*        (2006.01)

(52) U.S. Cl.
CPC ............. *H05K 1/113* (2013.01); *H05K 1/181* (2013.01); *H05K 2201/09227* (2013.01); *H05K 2201/0939* (2013.01); *H05K 2201/09481* (2013.01); *H05K 2201/096* (2013.01); *H05K 2201/09854* (2013.01)

(58) Field of Classification Search
CPC ......... H05K 1/113; H05K 2201/09481; H05K 2201/096; H05K 2201/0367; H05K 2201/09563
See application file for complete search history.

(56) References Cited

U.S. PATENT DOCUMENTS 6,187,652 B1 *  2/2001  Chou ................... H05K 3/4623
                                                          438/455

* cited by examiner

*Primary Examiner* — Sherman Ng
(74) *Attorney, Agent, or Firm* — MUNCY, GEISSLER, OLDS & LOWE, P.C.

(57) ABSTRACT

An electronic device includes a first substrate, a second substrate, plural conductive pads, plural hole structures, plural connection pads and plural conductive structures. Hole structures penetrate through the first and second substrates, and are arranged corresponding to the conductive pads. Second ends of hole structures are located at the second substrate, and the corresponding conductive pad is exposed by one of the second ends. Connection pads enclose first ends of hole structures. Conductive structures are arranged in the hole structures and electrically connected to corresponding conductive pads and connection pads. The second diameter portion of each conductive structure penetrates through first substrate and conductive pad and is electrically connected to corresponding connection pad and conductive pad, and first diameter portion thereof penetrates through second substrate and is electrically connected to corresponding conductive pad. Each conductive pad defines an opening, which is exposed by second end of corresponding hole structure.

15 Claims, 3 Drawing Sheets

ELECTRONIC DEVICE

CROSS REFERENCE TO RELATED APPLICATIONS

This Non-provisional application claims priority under 35 U.S.C. § 119(a) on Patent Application No(s). 111134192 filed in Taiwan, Republic of China on Sep. 8, 2022, and 112115051 filed in Taiwan, Republic of China on Apr. 21, 2023, the entire contents of which are hereby incorporated by reference.

BACKGROUND

Technology Field

The present disclosure relates to an electronic device and, in particular, to an electronic device that can achieve signal transmission by hole structures.

Description of Related Art

In the manufacturing process of electronic devices, especially the optoelectronic devices, in order to electrically connect the circuits on the upper and lower surfaces of the electronic device, the conventional solution is to drill holes through the substrate first, and then form a conductive film in the holes by an electroplating process. The plated conductive film in the holes can be electrically connected to the circuits on the upper and lower surfaces. Another solution is to use side jumpers aside from the electronic device to electrically connect the circuits on the upper and lower surfaces from the side of the electronic device, so as to achieve the purpose of signal transmission.

SUMMARY

One or more exemplary embodiments of this disclosure are to provide an electronic device that is manufactured by a novel approach for achieving signal transmission.

An electronic device of one exemplary embodiment includes a first substrate, a second substrate, a plurality of conductive pads, a plurality of hole structures, a plurality of connection pads, and a plurality of conductive structures. The first substrate and the second substrate are stacked on one another. The plurality of conductive pads are arranged between the first substrate and the second substrate. The plurality of hole structures penetrate through the first substrate and the second substrate respectively and are arranged corresponding to the conductive pads. Each hole structure defines a first end and a second end opposite to each other. The second ends of the hole structures are located at a surface of the second substrate and away from the first substrate, and the corresponding conductive pad is exposed by the second end of one of the hole structures. The first ends of the hole structures are located at another surface of the first substrate and away from the second substrate. The plurality of connection pads enclose the first ends of the hole structures located at the first substrate. The plurality of conductive structures are arranged in the hole structures and electrically connected to the corresponding conductive pads and the corresponding connection pads. Each conductive structure defines a first diameter portion and a second diameter portion. The second diameter portion penetrates through the first substrate and the conductive pad and is electrically connected to the corresponding connection pad and the corresponding conductive pad, and the first diameter portion penetrates through the second substrate and is electrically connected to the corresponding conductive pad. Each of the conductive pads defines an opening, and the opening is exposed by the second end of the corresponding hole structure located at the second substrate.

In one exemplary embodiment, each of the conductive pads defines an opening, and a width of the opening is less than that of the second end of the corresponding hole structure arranged at the surface of the second substrate.

In one exemplary embodiment, the electronic device further includes a bonding layer arranged between the first substrate and the second substrate.

In one exemplary embodiment, the first substrate defines a first surface and a second surface opposite to each other, the second substrate defines a third surface and a fourth surface opposite to each other, and the second surface of the first substrate is located between the first surface of the first substrate and the third surface of the second substrate.

In one exemplary embodiment, each of the hole structures includes a through hole and a via hole, the through hole penetrates through the corresponding first substrate and the corresponding conductive pad, and the via hole penetrates the corresponding second substrate; one end of each of the through holes is enclosed by the corresponding connection pad, the second diameter portion of each of the conductive structures is disposed in the corresponding through hole, and the first diameter portion of each of the conductive structures is disposed in the corresponding via hole.

In one exemplary embodiment, in each of the conductive structures, the first diameter portion defines a column segment and a cap segment in which the column segment is set between the second diameter portion and the cap segment, the column segment is disposed in the via hole, and a projection area of the cap segment in a direction perpendicular to the fourth surface overlaps at least part of the corresponding via hole.

In one exemplary embodiment, the first surface of the first substrate is configured with a first trace layer, and the first trace layer is electrically connected to the connection pads.

In one exemplary embodiment, the first trace layer defines a thickness, and the thickness is not greater than ¼ mil.

In one exemplary embodiment, the third surface of the second substrate is configured with a second trace layer, and the second trace layer is electrically connected to the conductive pads.

In one exemplary embodiment, the fourth surface of the second substrate is configured with a third trace layer, and the third trace layer is electrically connected to the first diameter portions of the conductive structures.

In one exemplary embodiment, the electronic device comprises a plurality of first substrates, and the first substrates are laid along the third surface of the second substrate.

In one exemplary embodiment, the electronic device comprises a plurality of first substrates and a plurality of second substrates, and the first substrates are laid along the third surfaces of the second substrates.

In one exemplary embodiment, the electronic device further includes a plurality of electronic components arranged at the first surface of the first substrate, and each of the electronic components is electrically connected to one of the connection pads.

In one exemplary embodiment, a diameter of one of the first diameter portions is greater than a diameter of the corresponding second diameter portion.

In one exemplary embodiment, a maximum diameter of one of the first diameter portions is greater than a maximum diameter of the corresponding second diameter portion.

In one exemplary embodiment, one of the first diameter portions and the corresponding second diameter portion are in a coaxial arrangement or in a stagger arrangement.

An electronic device of one exemplary embodiment includes a first substrate, a second substrate, a plurality of conductive pads, a plurality of hole structures, a plurality of connection pads, and a plurality of conductive structures. The first substrate and the second substrate are stacked on one another. The plurality of conductive pads are arranged between the first substrate and the second substrate. The plurality of hole structures penetrate through the first substrate and the second substrate respectively and are arranged corresponding to the conductive pads. Each of the hole structures defines a first end and a second end opposite to each other. The second ends of the hole structures are located at a surface of the second substrate and away from the first substrate, and the corresponding conductive pad is exposed by the second end of one of the hole structures. The first ends of the hole structures are located at another surface of the first substrate and away from the second substrate. The plurality of connection pads enclose the first ends of the hole structures located at the surface of the first substrate. The plurality of conductive structures are arranged in the hole structures and electrically connected to the corresponding conductive pads and the corresponding connection pads. Each of the conductive structures defines a first diameter portion and a second diameter portion. The second diameter portion penetrates through the first substrate and the conductive pad and is electrically connected to the corresponding connection pad and the corresponding conductive pad. The first diameter portion penetrates through the second substrate and is electrically connected to the corresponding conductive pad. The diameter of one of the first diameter portions is greater than the diameter of the corresponding second diameter portion. Each of the conductive pads defines an opening, and the opening is exposed by the second end of the corresponding hole structure located at the surface of the second substrate.

In one exemplary embodiment, a maximum diameter of one of the first diameter portions is greater than a maximum diameter of the corresponding second diameter portion.

In one exemplary embodiment, one of the first diameter portions and the corresponding second diameter portion are in a coaxial arrangement.

In one exemplary embodiment, a width of the opening is less than that of the second end of the corresponding hole structure arranged at the surface of the second substrate.

In one exemplary embodiment, one or more additional substrates are applied between the first and second substrates, and the hole structures penetrate through the additional substrate(s).

In one exemplary embodiment, ones of the additional substrates are laid and tiled along either one of the inner surfaces of the first and second substrates.

In one exemplary embodiment, ones of the additional substrates are stacked in the direction perpendicular to either one of the outer surfaces of the first and second substrates.

In one exemplary embodiment, ones of the additional substrates are provided with a trace layer on either or both opposite surfaces thereof.

As mentioned above, in the electronic device of this disclosure, a plurality of conductive pads are arranged between the first substrate and the second substrate, a plurality of hole structures penetrate through the first substrate and the second substrate respectively and are arranged corresponding to the conductive pads, wherein each hole structure defines a first end and a second end. The second ends of the hole structures arranged at a surface of the second substrate are away from the first substrate, and the corresponding conductive pad is exposed by the second end of the corresponding hole structure. The first ends of the hole structures arranged at a surface of the first substrate are away from the second substrate, and a plurality of connection pads enclose the first ends of the hole structures arranged at the surface of the first substrate. The conductive structures are disposed in the hole structures and electrically connected to the corresponding conductive pads and the corresponding connection pads. The second diameter portion of each conductive structure penetrates through the first substrate and the conductive pad, and is electrically connected to the corresponding connection pad and the corresponding conductive pad, and the first diameter portion of each conductive structure penetrates through the second substrate and is electrically connected to the corresponding conductive pad. The opening of each conductive pad is exposed by the second end of the corresponding hole structure located at the surface of the second substrate. According to the configuration and design of this disclosure, the electrical signals can be transmitted between the trace layers arranged at the upper and lower surfaces of the electronic device by the conductive structure arranged in the hole structures of the electronic device, and the electrical signal can be transmitted between the trace layers by the conductive structures arranged in the hole structures and the internal conductive pads. Therefore, the electronic device of the present disclosure utilizes the hole structures to electrically connect an outermost trace layer through the connection pad(s) with the internal conductive pads, so as to achieve the signal transmission.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements. The drawings of the following embodiments only illustrate the relative relationship between elements or units, and do not represent the actual size or proportion of the elements or units.

Figure 1:
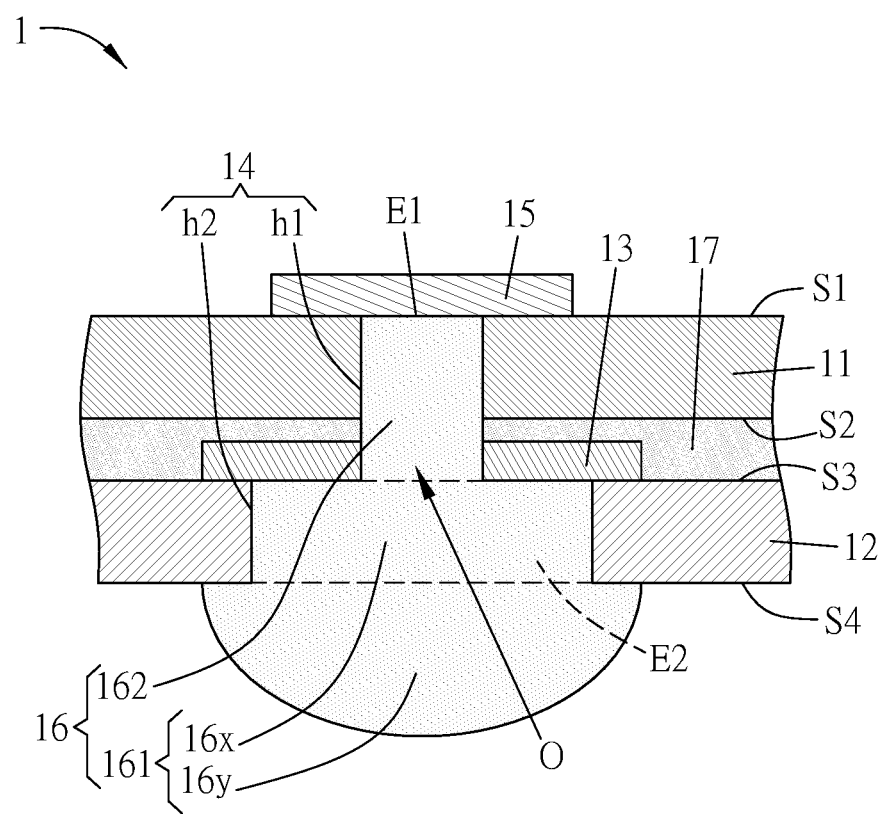
FIG. 1 is a schematic diagram showing a part of the electronic device according to an embodiment of this disclosure.

FIG. 1 is a schematic diagram showing a part of the electronic device 1 according to an embodiment of this disclosure.

Referring to FIG. 1, the electronic device 1 includes a first substrate 11, a second substrate 12, a plurality of conductive pads 13, a plurality of hole structures 14, a plurality of connection pads 15, and a plurality of conductive structures 16. In this case, FIG. 1 only shows one conductive pad 13, one hole structure 14, one connection pad 14, and one conductive structure 16 for an illustration. In addition, the electronic device 1 of this embodiment can further include a bonding layer 17.

The first substrate 11 and the second substrate 12 are stacked on one another. The first substrate 11 defines a first surface S1 and a second surface S2 opposite to the first surface S1, and the second substrate 12 defines a third surface S3 and a fourth surface S4 opposite to the third surface S3. In this embodiment, the second surface S2 (the lower surface) of the first substrate 11 is located between the first surface S1 (the upper surface) of the first substrate 11 and the third surface S3 (the upper surface) of the second substrate 12. The second surface S2 and the third surface S3 are located inside the electronic device 1, and the first surface S1 and the fourth surface S4 are the outer surfaces of the electronic device 1 (i.e., the outermost surfaces of the electronic device 1). The first substrate 11 and the second substrate 12 can be resilient boards, rigid boards or composite boards, and the materials thereof can include, for example, glass, glass fiber epoxy resin (e.g. FR4), low temperature co-fired ceramics (LTCC), polyimide (PI), polytetrafluoroethylene (PTFE), polyphenylene oxide (PPO) or polyphenylene ether (PPE), or a substrate composed of composite materials including at least one of the aforementioned materials. In this embodiment, the first substrate 11 is a resilient board, such as a PI substrate, and the second substrate 12 is a rigid board, such as a single-layer glass substrate.

The bonding layer 17 is arranged between the second surface S2 of the first substrate 11 and the third surface S3 of the second substrate 12, so that the first substrate 11 and the second substrate 12 are connected to each other by the bonding layer 17. The bonding layer 17 can be laid continuously (e.g. laid continuously along a plane) or discontinuously (e.g. laid intermittently along a plane, or laid along the areas without interfering the functions of other components). The bonding layer 17 can be an insulating adhesive, and the material thereof can be, for example but not limited to, optical clear adhesive (OCA), optical clear resin (OCR), polyimide (PI), or the likes. It should be noted that the electronic device 1 of this embodiment includes one first substrate 11, but the electronic device of another embodiment can include two or more first substrates 11. In different embodiments, the two or more first substrates 11 can be laid and tiled along the third surface S3 of the second substrate 12 (i.e., the first substrates 11 are laid and tiled along the plane of the third surface S3 of the second substrate 12), and the first substrates 11 are connected to the second substrate 12 by the bonding layer 17. In different embodiments, the electronic device can include two or more second substrates 12, so that the two or more first substrates 11 are laid alone a virtual surface tiled by the third surfaces S3 of two or more second substrates 12. In addition, the second substrate(s) 12 and the first substrate(s) 11 can be partially overlapped in the direction perpendicular to any of the surfaces S1 to S4. That is, the second substrate(s) 12 and the first substrate(s) 11 are arranged in a stagger manner in the direction perpendicular to any of the surfaces S1 to S4. The rest of the arrangement details will not be further described here.

A plurality of conductive pads 13 are arranged between the first substrate 11 and the second substrate 12. In this case, the conductive pads 13 are separately arranged at the third surface S3 of the second substrate 12. The conductive pad 13 can be a continuous ring or a C-shaped ring with an opening O defined in the middle thereof. In some embodiments, the material of the conductive pads 13 can be, for example, silver, copper, tin, or any of other conductive materials.

The hole structures 14 respectively penetrate through the first substrate 11 and the second substrate 12, and are arranged corresponding to the conductive pads 13. In this embodiment, the hole structures 14 are arranged correspondingly to the conductive pads 13 in a one-on-one manner. Each hole structure 14 defines a first end E1 and a second end E2 opposite to each other. The second ends E2 of the hole structures 14 arranged at a surface of the second substrate 12 are away from the first substrate 11, and the corresponding conductive pad 13 is exposed by the second end E2 of one of the hole structures 14. The first ends E1 of the hole structures 14 arranged at another surface of the first substrate 11 are away from the second substrate 12. A plurality of connection pads 15 are arranged at the first surface S1 of the first substrate 11, and each connection pad 15 encloses the first end E1 of the corresponding hole structure 14. The second end E2 of each hole structure 14 penetrates through the corresponding conductive pad 13. Specifically, each hole structure 14 of this embodiment includes a through hole h1 and a via hole h2, which communicate with each other. The through hole h1 penetrates through the corresponding first substrate 11 and the corresponding conductive pad 13, and the via hole h2 penetrates through the corresponding second substrate 12. In this case, the through hole h1 of each hole structure 14 (or each conductive structure 16) further penetrates through the bonding layer 17. In addition, one end (the first end E1) of each through hole h1 is enclosed by a corresponding connection pad 15, and the corresponding conductive pad 13 is exposed by the second end E2 of the corresponding hole structure 14. In this embodiment, "exposing" the corresponding conductive pad 13 means that, before the conductive structure 16 is filled into the hole structure 14, the conductive pad 13 is not completely covered by the second substrate 12, and the conductive pad 13 can be exposed. In some embodiments, the material of the connection pad 15 can include gold, copper, aluminum, or any combination thereof, or an alloy of any combination thereof, or any of other conductive metal materials. This disclosure is not limited thereto. In different embodiments, one or more than one of the connection pads 15 (not all of the connection pads 15) can be configured to enclose the first ends E1 of the hole structures 14 arranged at a surface of the first substrate 11, and this disclosure is not limited thereto.

Each conductive structure 16 is correspondingly arranged in one of the hole structures 14 (in a one-on-one manner), and each conductive structure 16 is electrically connected to the corresponding conductive pad 13 and the corresponding connection pad 15. Specifically, each hole structure 14 can be filled (can be fully filled or partially filled) with a conductive structure 16, so that the conductive structure 16 is in contact with and electrically connected to the connection pad 15 located at the first end E1 of the hole structure 14. The conductive structure 16 is also in contact with and electrically connected to the corresponding conductive pad 13. In this embodiment, each conductive structure 16 defines a first diameter portion 161 and a second diameter portion 162, and the width of the first diameter portion 161 is greater than that of the second diameter portion 162. The second diameter portion 162 is correspondingly arranged in the through hole h1, penetrates through the first substrate 11 and the conductive pad 13, and is electrically connected to the corresponding connection pad 15 and the corresponding conductive pad 13. The first diameter portion 161 is correspondingly arranged in the via hole h2, penetrates through the second substrate 12, and is electrically connected to the corresponding conductive pad 13. In this embodiment, the second diameter portion 162 also penetrates through the bonding layer 17, and the first diameter portion 161 covers a part of the fourth surface S4. In some embodiments, each of the conductive structures 16 is made of a single material. In practice, for example, the silver adhesive, copper adhesive, solder, or any of other conductive materials can be placed in the through hole h1 and the via hole h2 simultaneously or separately to form the conductive structure 16 having the first diameter portion 161 and the second diameter portion 162, which can cover a part of the fourth surface S4. In some embodiments, the conductive materials filled in the through hole h1 and the via hole h2 may be different conductive materials. It should be noted that the diameter of the first diameter portion 161 can be greater than the diameter of the corresponding second diameter portion 162. For example, the maximum diameter of the first diameter portion 161 is greater than the maximum diameter of the corresponding second diameter portion 162, wherein the first diameter portion 161 and the corresponding second diameter portion 162 can be arranged coaxially. In different aspects, the diameter of the first diameter portion 161 can be not greater than the diameter of the corresponding second diameter portion 162, wherein the first diameter portion 161 and the corresponding second diameter portion 162 can be arranged in an off-axis manner.

In addition, in each conductive structure 16 of this embodiment, the first diameter portion 161 defines a column segment 16x and a cap segment 16y, and the width of the cap segment 16y is greater than that of the column segment 16x. In this case, the column segment 16x is set between the second diameter portion 162 and the cap segment 16y and disposed in the via hole h2 (fully filling the via hole h2), and the projection area of the cap segment in the direction perpendicular to the fourth surface S4 overlaps at least part of the corresponding via hole h2 and a part of the fourth surface S4. In addition, the width of the opening O of each conductive pad 13 in this embodiment is less than that of the second end E2 of the corresponding hole structure 14; in another words, each opening O is narrower than the second end E2 in each hole structure 14. Therefore, when the conductive structure 16 is arranged in the hole structure 14, the first diameter portion 161 of each conductive structure 16 covers not only a part of the fourth surface S4 but also the conductive pad 13. It should be noted that the aforementioned "width" is defined as the width parallel to the third surface S3 or the fourth surface S4 of the second substrate 12.

Therefore, electrical signals can be transmitted between the connection pads 15 and the fourth surface S4 of the second substrate 12 by the conductive structure 16 in the hole structure 14. In other words, electrical signals can be transmitted from the connection pads 15 on the first surface S1 of the first substrate 11 (i.e., the outermost layer of the electronic device 1) to the fourth surface S4 of the second substrate 12 by the conductive structure 16; and vice versa.

As mentioned above, in the electronic device 1 of this embodiment, a plurality of conductive pads 13 are arranged between the first substrate 11 and the second substrate 12; a plurality of hole structures 14 respectively penetrate through the first substrate 11 and the second substrate 12, and are arranged corresponding to the conductive pads 13, and the corresponding conductive pad 13 is exposed by the second end E2 of the corresponding hole structure 14; a plurality of connection pads 15 enclose the first ends E1 of the hole structures 14; and each conductive structure 16 is arranged in the corresponding hole structure 14, and is electrically connected to the corresponding conductive pad 13 and the corresponding connection pad 15. Herein, the second diameter portion 162 of each conductive structure 16 penetrates through the first substrate 11 and the conductive pad 13 and is electrically connected to the connection pad 15 and the conductive pad 13. The first diameter portion 161 penetrates through the second substrate 12 and is electrically connected to the conductive pad 13, and the width of the opening O of each conductive pad 13 is less than the width of the second end E2 of the corresponding hole structure 14. According to this structural design, the electrical signals can be transmitted between the connection pads 15, the conductive pads 13 and the fourth surface S4 of the second substrate 12 by the conductive structures 16 arranged in the hole structures 14. Therefore, the electronic device 1 of this embodiment utilizes the hole structures 14 (semi-blind hole) to electrically connect the traces of the outermost layers (i.e., the first surface S1 and the fourth surface S4) and the internal conductive pads 13, so as to achieve the purpose of signal transmission.

Figure 2:
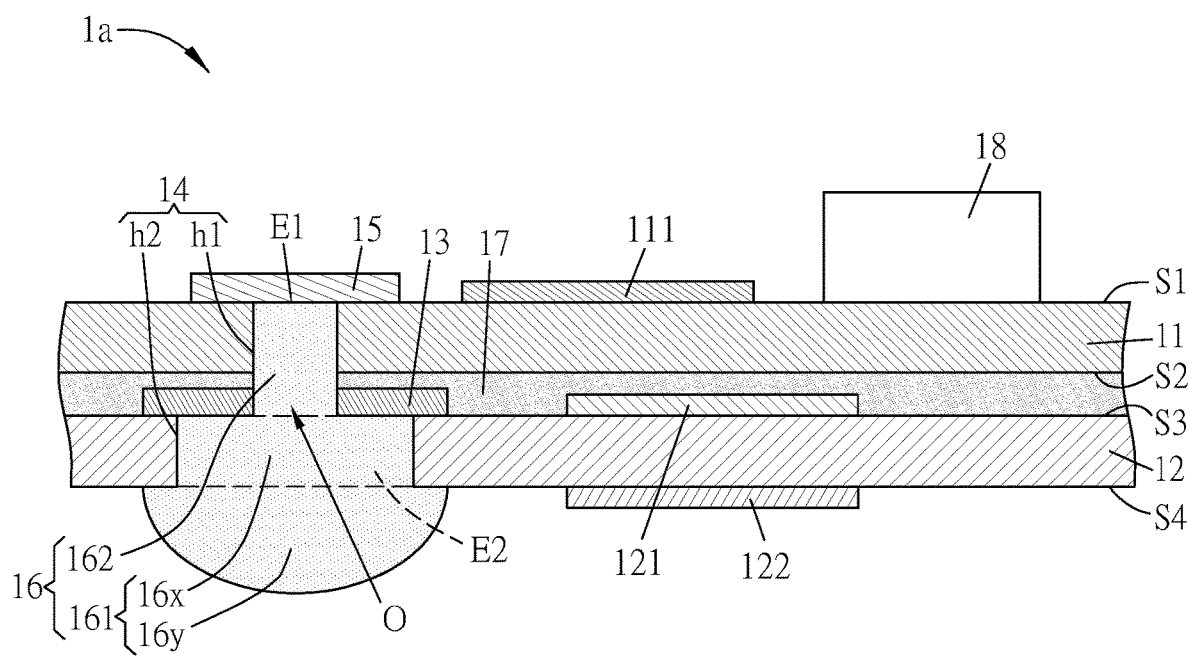
FIGS. 2 to 4 are schematic diagrams showing a part of the electronic device according to different embodiments of this disclosure.
Figure 3:
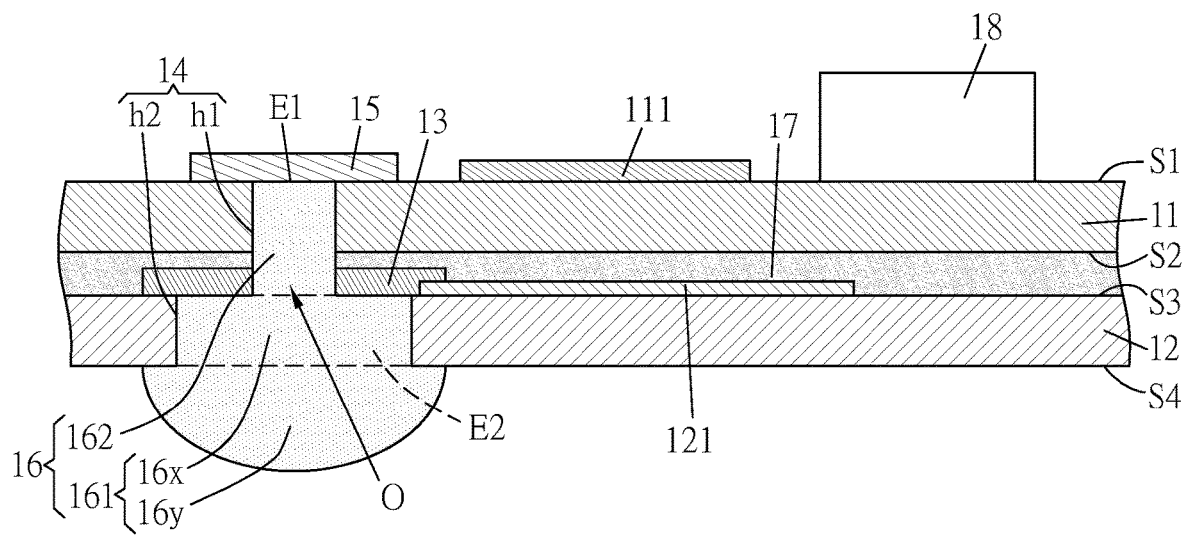
Figure 4:
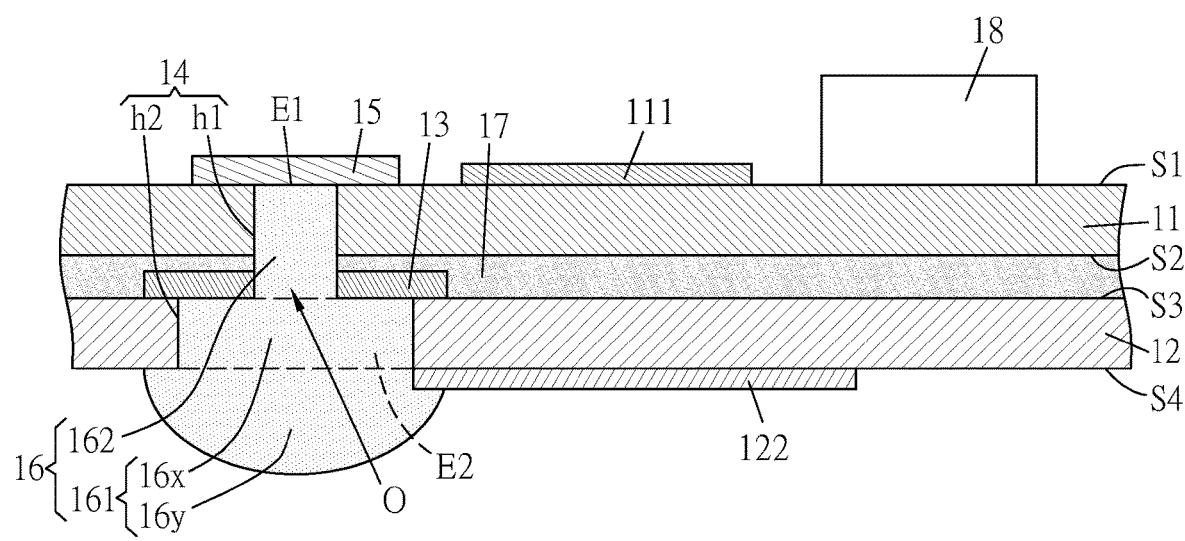

In addition, FIGS. 2 to 4 are schematic diagrams showing a part of the electronic device according to different embodiments of this disclosure.

As shown in FIG. 2, the electronic device 1a of this embodiment is mostly the same as that of the previous embodiment. Unlike the electronic device 1, the electronic device 1a of this embodiment further includes a first trace layer 111, a second trace layer 121, and a third trace layer 122. The first trace layer 111 is arranged at the first surface S1 of the first substrate 11 and is electrically connected to the connection pads 15. The second trace layer 121 is arranged at the third surface S3 of the second substrate 12 and is electrically connected to the conductive pads 13. The third trace layer 122 is arranged at the fourth surface S4 of the second substrate 12 and is electrically connected to the first diameter portions 161 of the conductive structures 16. According to this configuration, electrical signals can be transmitted between the first trace layer 111, the second trace layer 121 and the third trace layer 122 by the connection pads 15, the conductive structures 16, and the conductive pads 13.

The first trace layer 111, the second trace layer 121 or the third trace layer 122 may include a conductive layer or/and conductive wires for transmitting electrical signals, and the material thereof may include metals such as gold, copper or aluminum, or any combination thereof, or the alloy of any combination thereof, or any of other conductive materials. In some embodiments, the first trace layer 111, the second trace layer 121 or the third trace layer 122 can be formed by a thin film process, so the thickness thereof can be relatively thinner. For example, the thickness of the first trace layer 111, the second trace layer 121 or the third trace layer 122 can be not greater than ¼ mil. In some embodiments, the first trace layer 111, the second trace layer 121 and the third trace layer 122 can be selectively configured according to requirements.

Please refer to FIGS. 3 and 4. Unlike the electronic device of the previous embodiments, the second trace layer 121 of the electronic device of FIG. 3 is electrically connected to one or more conductive pads 13, and the third trace layer 122 of the electronic device of FIG. 4 is electrically connected to one or more conductive structures 16. Herein, the second trace layer 121 may not be electrically connected to all of the conductive pads 13, and the third trace layer 122 may not be electrically connected to all of the conductive structures 16. In some embodiments, the two electrical connection modes as shown in FIG. 3 and FIG. 4 can be applied at the same time. Accordingly, this disclosure can not only provide different electrical connection modes for different trace layers arranged at the first substrate 11 and the second substrate 12, but also provide the electrical connection between the second trace layer 121 and the third trace layer 122, which are both arranged at the second substrate 12 and are partially or entirely communicated with at least one conductive structure 16 of two independent substrates. Based on this configuration, the manufacturing process for conducting the second trace layer 121 and the third trace layer 122 arranged at the second substrate 12 can be integrated in this disclosure, thereby reducing the process steps, decreasing the manufacturing cost, relatively thinning the thickness of the bonding layer 17, and improving efficiency.

In addition, the electronic device 1a can further include a plurality of electronic components 18 (only one is shown in FIG. 2). The electronic components 18 are arranged at the first surface S1 of the first substrate 11, and each electronic component 18 is electrically connected to at least one of the connection pads 15. In some embodiments, the electronic component 18 can be electrically connected to one of the connection pads 15 by the first trace layer 111, and then electrically connected to the corresponding conductive pad 13, the corresponding second trace layer 121 or the corresponding third trace layer 122 by the conductive structure 16. In some embodiments, the electronic component 18 can be a driver, an active component, a passive component, an active circuit or a passive circuit. In some embodiments, one or more than one of the electronic components 18 can be self-luminous components such as, for example but not limited to, light-emitting diodes (LEDs), Mini LEDs or Micro LEDs. In some embodiments, one or more than one of the electronic components 18 can be flip-chip components (i.e., surface mount devices (SMD)). In some embodiments, one or more than one of the electronic components 18 can be thin-film components manufactured by thin-film processes, such as thin-film transistors (TFT). The thin-film processes can include low-temperature polysilicon (LTPS) semiconductor process, high-temperature polysilicon (HTPS) semiconductor process, low-temperature polycrystalline oxide (LTPO) semiconductor process, or indium-gallium-zinc oxide (IGZO) semiconductor process, or the likes. In some embodiments, one or more than one of the electronic components 18 can be radio frequency ICs, driver ICs (e.g. silicon ICs or non-silicon ICs). The RF IC can be, for example, a silicon RFIC, or a non-silicon RFIC (e.g. a GaAs MMIC). The type or kind of the electronic components 18 is not limited in this disclosure.

In this embodiment, the electrical signal sent by the electronic component 18 can be transmitted to the second trace layer 121 arranged at the third surface S3 or the third trace layer 122 arranged at the fourth surface S4 by the first trace layer 111, the connection pad(s) 15, the conductive structure(s) 16 and the conductive pad(s) 13. In another case, electrical signals can be transmitted to the electronic component 18 by the second trace layer 121, the conductive pad(s) 13, the conductive structure(s) 16, the connection pad(s) 15 and the first trace layer 111, or by the third trace layer 122, the conductive structure(s) 16, the connection pad(s) 15 and the first trace layer 111. In addition, either one or all of the trace layers may further comprise some circuits.

In some embodiments, the electronic device includes a first substrate, a second substrate, a plurality of conductive pads, a plurality of hole structures, a plurality of connection pads, and a plurality of conductive structures. The first substrate and the second substrate are stacked on one another. The plurality of conductive pads are arranged between the first substrate and the second substrate. The plurality of hole structures penetrate through the first substrate and the second substrate respectively and are arranged corresponding to the conductive pads. The second ends of the hole structures are located at a surface of the second substrate and away from the first substrate, and the corresponding conductive pad is exposed by the corresponding second end of one of the hole structure. The first ends of the hole structures are located at a surface of the first substrate and away from the second substrate. The plurality of conductive structures are arranged in the hole structures and electrically connected to the corresponding conductive pads and the corresponding connection pads. Each of the conductive structures defines a first diameter portion and a second diameter portion. The second diameter portion penetrates through the first substrate and the conductive pad and is electrically connected to the corresponding connection pad and the corresponding conductive pad. The first diameter portion penetrates through the second substrate and is electrically connected to the corresponding conductive pad. The diameter of one of the first diameter portions is greater than the diameter of the corresponding second diameter portion.

In summary, in the electronic device of this disclosure, a plurality of conductive pads are arranged between the first substrate and the second substrate, a plurality of hole structures penetrate through the first substrate and the second substrate respectively and are arranged corresponding to the conductive pads, wherein each hole structure defines a first end a second end. The second ends of the hole structures arranged at a surface of the second substrate are away from the first substrate, and the corresponding conductive pad is exposed by the second end of the corresponding hole structure. The first ends of the hole structures arranged at a surface of the first substrate are away from the second substrate, and a plurality of connection pads enclose the first ends of the hole structures arranged at the surface of the first substrate. The conductive structures are disposed in the hole structures and electrically connected to the corresponding conductive pads and the corresponding connection pads. The second diameter portion of each conductive structure penetrates through the first substrate and the conductive pad, and is electrically connected to the corresponding connection pad and the corresponding conductive pad, and the first diameter portion of each conductive structure penetrates through the second substrate and is electrically connected to the corresponding conductive pad. The opening of each conductive pad is exposed by the second end of the corresponding hole structure located at the surface of the second substrate. According to the configuration and design of this disclosure, the electrical signals can be transmitted between the trace layers arranged at the upper and lower surfaces of the electronic device by the conductive structure arranged in the hole structures of the electronic device. In addition, the electrical signals can be also transmitted between the trace layers by the conductive structures arranged in the hole structures and the internal conductive pads. Therefore, the electronic device of the present disclosure utilizes the hole structures to electrically connect an outermost trace layer through the connection pad(s) with the internal conductive pads, so as to achieve the signal transmission. According to the present invention, it may further include one or more additional substrates applied between the first and second substrates, and the electrical connection between the trace layers of both substrates is maintained whether or not possible additional substrates are included.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An electronic device, comprising: a first substrate and a second substrate stacked on one another; a bonding layer arranged between the first substrate and the second substrate, a plurality of conductive pads arranged in the bonding layer and between the first substrate and the second substrate; a plurality of hole structures penetrating through the first substrate, the bonding layer, and the second substrate respectively and arranged corresponding to the conductive pads, wherein each of the hole structures defines a first end and a second end opposite to each other, the second ends of the hole structures are located at the second substrate and away from the first substrate, the corresponding conductive pad is exposed by the second end of the corresponding hole structure, and the first ends of the hole structures are located at the first substrate and away from the second substrate; a plurality of connection pads enclosing the first ends of the hole structures located at the first substrate; and a plurality of conductive structures arranged in the hole structures and electrically connected to the corresponding conductive pads and the corresponding connection pads; wherein, each of the conductive structures defines a first diameter portion and a second diameter portion, the second diameter portion penetrates through the first substrate, the bonding layer, and the conductive pad and is electrically connected to the corresponding connection pad and the corresponding conductive pad, and the first diameter portion penetrates through the second substrate and is electrically connected to the corresponding conductive pad; and wherein, each of the conductive pads defines an opening, and the opening is exposed by the second end of the corresponding hole structure located at the second substrate.

2. The electronic device of claim 1, wherein the first substrate defines a first surface and a second surface opposite to each other, the second substrate defines a third surface and a fourth surface opposite to each other, and the second surface of the first substrate is located between the first surface of the first substrate and the third surface of the second substrate.

3. The electronic device of claim 2, wherein each of the hole structures comprises a through hole and a via hole, the through hole penetrates through the corresponding first substrate, the bonding layer, and the corresponding conductive pad, the via hole penetrates the corresponding second substrate, one end of each of the through holes is enclosed by the corresponding connection pad, the second diameter portion of each of the conductive structures is arranged corresponding to the through hole, and the first diameter portion of each of the conductive structures is arranged corresponding to the via hole.

4. The electronic device of claim 3, wherein, in each of the conductive structures, the first diameter portion defines a column segment and a cap segment, the column segment is disposed in the via hole and set between the second diameter portion and the cap segment, and a projection area of the cap segment in a direction perpendicular to the fourth surface overlaps at least part of the corresponding via hole.

5. The electronic device of claim 2, wherein the first surface of the first substrate is configured with a first trace layer, and the first trace layer is electrically connected to the connection pads.

6. The electronic device of claim 5, wherein the first trace layer defines a thickness, and the thickness is not greater than ¼ mil.

7. The electronic device of claim 2, wherein the third surface of the second substrate is configured with a second trace layer, and the second trace layer is electrically connected to the conductive pads.

8. The electronic device of claim 2, wherein the fourth surface of the second substrate is configured with a third trace layer, and the third trace layer is electrically connected to the first diameter portions of the conductive structures.

9. The electronic device of claim 2, wherein the electronic device comprises a plurality of the first substrates, and the first substrates are laid along the third surface of the second substrate.

10. The electronic device of claim 2, further comprising: a plurality of electronic components arranged at the first surface of the first substrate, wherein each of the electronic components is electrically connected to one of the connection pads.

11. The electronic device of claim 1, wherein a diameter of one of the first diameter portions is greater than a diameter of the corresponding second diameter portion.

12. An electronic device, comprising: a first substrate and a second substrate stacked on one another; a bonding layer arranged between the first substrate and the second substrate, a plurality of conductive pads arranged in the bonding layer and between the first substrate and the second substrate; a plurality of hole structures penetrating through the first substrate, the bonding layer, and the second substrate respectively and arranged corresponding to the conductive pads, wherein each of the hole structures defines a first end and a second end opposite to each other, the second ends of the hole structures are located at the second substrate and away from the first substrate, the corresponding conductive pad is exposed by the second end of the corresponding hole structure, and the first ends of the hole structures are located at the first substrate and away from the second substrate; a plurality of connection pads enclosing the first ends of the hole structures located at the first substrate; and a plurality of conductive structures arranged in the hole structures and electrically connected to the corresponding conductive pads and the corresponding connection pads; wherein, each of the conductive structures defines a first diameter portion and a second diameter portion, the second diameter portion penetrates through the first substrate, the bonding layer, and the conductive pad and is electrically connected to the corresponding connection pad and the corresponding conductive pad, the first diameter portion penetrates through the second substrate and is electrically connected to the corresponding conductive pad, and a diameter of one of the first diameter portions is greater than a diameter of the corresponding second diameter portion; and wherein, each of the conductive pads defines an opening, and the opening is exposed by the second end of the corresponding hole structure located at the second substrate.

13. The electronic device of claim 12, wherein a maximum diameter of one of the first diameter portions is greater than a maximum diameter of the corresponding second diameter portion.

14. The electronic device of claim 12, wherein one of the first diameter portions and the corresponding second diameter portion are in a coaxial arrangement.

15. The electronic device of claim 12, wherein a width of the opening is less than a width of the second end of the corresponding hole structure arranged at the second substrate.

* * * * *